(12) United States Patent
Althaus et al.

(10) Patent No.: US 12,117,407 B2
(45) Date of Patent: Oct. 15, 2024

(54) DETERMINING GEOLOGIC PROPERTIES OF A ROCK SAMPLE

(71) Applicant: Saudi Arabian Oil Company, Dhahran (SA)

(72) Inventors: Stacey M. Althaus, Houston, TX (US); Jin-Hong Chen, Katy, TX (US); John David Broyles, Houston, TX (US); Mohammed Boudjatit, El Kennar (DZ)

(73) Assignee: Saudi Arabian Oil Company, Dhahran (SA)

( * ) Notice: Subject to any disclaimer, the term of this patent is extended or adjusted under 35 U.S.C. 154(b) by 143 days.

(21) Appl. No.: 18/166,143

(22) Filed: Feb. 8, 2023

(65) Prior Publication Data

US 2024/0264101 A1    Aug. 8, 2024

(51) Int. Cl.
  *G01N 24/08* (2006.01)
  *G01N 15/08* (2006.01)

(52) U.S. Cl.
  CPC ......... *G01N 24/081* (2013.01); *G01N 15/088* (2013.01)

(58) Field of Classification Search
  CPC .......................... G01N 24/081; G01N 15/088
  See application file for complete search history.

(56) References Cited

U.S. PATENT DOCUMENTS

| | | |
|---|---|---|
| 5,442,950 A | 8/1995 | Unalmiser et al. |
| 10,422,916 B2 | 9/2019 | Zhang et al. |
| 10,488,352 B2 | 11/2019 | Chen et al. |
| 10,557,962 B2 | 2/2020 | Chen et al. |
| 10,858,936 B2 | 4/2020 | Chen et al. |
| 11,598,736 B2 | 3/2023 | Althaus et al. |
| 2016/0341652 A1 | 11/2016 | Liu et al. |
| 2018/0081077 A1 | 3/2018 | Chen et al. |
| 2018/0217073 A1 | 8/2018 | Chen et al. |
| 2019/0049616 A1 | 2/2019 | Zhang et al. |
| 2019/0331825 A1 | 10/2019 | Zhang et al. |

(Continued)

FOREIGN PATENT DOCUMENTS

WO    WO 2019157413    8/2019

OTHER PUBLICATIONS

Althaus et al., "NMR Measurement of Porosity and Density from Drill Cuttings of Unconventional Tight Reservoirs," presented at the SPWLA 60th Annual Logging Symposium, The Woodlands, Texas, Jun. 17-19, 2019, 6 pages.

(Continued)

*Primary Examiner* — G. M. A Hyder
(74) *Attorney, Agent, or Firm* — Fish & Richardson P.C.

(57) ABSTRACT

Techniques for determining a geologic property of a rock sample include (i) measuring a mass of a processed rock sample that includes a solid matrix and a fluid entrained within the solid matrix; (ii) measuring, using nuclear magnetic resonance (NMR), a volume of the fluid entrained within the solid matrix; (iii) measuring, using a gas porosimeter, a volume of the solid matrix of the processed rock sample; (iv) measuring, with a mercury immersion porosimeter, a bulk volume of the processed rock sample; and (v) determining, based at least on the measured volume of the fluid, the measured volume of the solid matrix, and the measured bulk volume, at least one of a bulk density, a grain density, or a porosity of the processed rock sample.

47 Claims, 4 Drawing Sheets

(56) References Cited

U.S. PATENT DOCUMENTS

| | | | |
|---|---|---|---|
| 2019/0331826 A1 | 10/2019 | Zhang et al. | |
| 2020/0102824 A1 | 4/2020 | Chen et al. | |
| 2022/0317074 A1* | 10/2022 | Althaus | G01N 24/081 |
| 2023/0243728 A1* | 8/2023 | Gao | G01N 15/08 73/38 |

OTHER PUBLICATIONS

Bertoncello et al., "Standards for Characterization of Rock Properties in Unconventional Reservoirs: Fluid Flow Mechanism, Quality Control, and Uncertainties," presented at the SPE Annual Technical Conference and Exhibition, New Orleans, Louisiana, Sep. 2013, 17 pages.

Chalmers et al., "Characterization of Gas Shale Pore Systems by Porosimetry, Pycnometry, Surface Area and Field Emission Scanning Electron Microscopy/Transmission Electron Microscopy Image Analyses: Examples from the Barnett, Woodford, Haynesville Marcellus and Doig Units," American Association of Petroleum Geologists (AAPG), AAPG Bulletin, Jun. 2012, 96:6, 1099-1119, 21 pages.

Clarkson et al., "Reservoir Engineering for Unconventional Gas Reservoirs: What Do we Have to Consider?," presented at the SPE North American Unconventional Gas Conference and Exhibition, The Woodlands, Texas, Jun. 14-16, 2011, 45 pages.

Dang et al., "Study of Drill Cuttings Porosity for Formation Evaluation," presented at the International Symposium of the Society of Core Analysts, Vienna, Austria, Aug. 2017, 9 pages.

Dean et al., "A convenient method for the determination of water in petroleum and other organic emulsions," The Journal of Industrial & Engineering Chemistry, May 1920, 12:5, 486-490, 5 pages.

Dunn et al., Nuclear Magnetic Resonance: Petrophysical and Logging Applications. Elsevier Science, Jan. 2002, 314 pages.

Handbook of Physical Properties of Rocks, vol. III, CRC Press Revivals, Robert S. Carmichael (ed)., 1984, 355 pages.

Jadwiga et al., "Petrophysical Characteristics of the Shale Gas Formations in the Baltic Basin, Northern Poland," Geosciences and Engineering, 6(9):9-18, 2018, 10 pages.

Kesserwan et al., "Porosity Measurements on Drill Cuttings—Comprehensive Inputs to Formation Evaluation near Real-Time While Drilling," presented at the Abu Dhabi International Petroleum Exhibition & Conference, Abu Dhabi, UAE, Nov. 13-16, 2017, 9 pages.

Kuila et al., "Total porosity measurement in gas shales by the water immersion porosimetry (WIP) method, " Fuel, 2014, 117:1115-1129, 15 pages.

Luffel et al., "New Core Analysis Methods for Measuring Reservoir Rock Properties of Devonian Shale," Journal of Petroleum Technology, Nov. 1992, 44(11):1184-1190, 7 pages.

Passey et al., "From Oil-Prone Source Rock to Gas-Producing Shale Reservoir—Geologic and Petrophysical Characterization and Unconventional Shale-Gas Reservoirs," SPE 131350, Society of Petroleum Engineers (SPE), presented at the CSP/SPE International Oil and Gas Conference and Exhibition in China, Beijing, China, Jun. 2-10, 2010, 29 pages.

Sidian et al., "Effect of Mineralogy on Nuclear Magnetic Resonance Surface Relaxivity: A Case Study of Middle Bakken and Three Forks Formations," Fuel 2015, 161, 197-206, 10 pages.

Timur, "Pulsed nuclear magnetic resonance studies of porosity, movable fluid, and permeability of sandstones." Journal of Petroleum Technology 21.06, Jun. 1969, 775-786, 12 pages.

Wang et al., "High-Field Nuclear Magnetic Resonance Observation of Gas Shale Fracturing by Methane Gas," Energy and Fuels, 2014, 28: 3638-3644, 7 pages.

* cited by examiner

DETERMINING GEOLOGIC PROPERTIES OF A ROCK SAMPLE

TECHNICAL FIELD

The present disclosure describes systems and methods for determining geologic properties of a rock sample.

BACKGROUND

Geologic properties of a rock sample can be used in evaluating a geologic formation. For example, some properties can give an indication of the mineralogy of the rock. Some properties can also be a prerequisite parameter in evaluating formation porosity in density logging.

SUMMARY

In an example implementation, a method of determining a geologic property of a rock sample includes (i) measuring a mass of a processed rock sample that includes a solid matrix and a fluid entrained within the solid matrix; (ii) measuring, using nuclear magnetic resonance (NMR), a volume of the fluid entrained within the solid matrix; (iii) measuring, using a gas porosimeter, a volume of the solid matrix of the processed rock sample; (iv) measuring, with a mercury immersion porosimeter, a bulk volume of the processed rock sample; and (v) determining, based at least on the measured volume of the fluid, the measured volume of the solid matrix, and the measured bulk volume, at least one of a bulk density, a grain density, or a porosity of the processed rock sample.

In an aspect combinable with the example implementation, the processed rock sample is free from chemical cleaning subsequent to removal of the processed rock sample from a subterranean formation.

In another aspect combinable with any of the previous aspects, the processed rock sample includes a plurality of drill cuttings or a plurality of crushed rock pieces.

In another aspect combinable with any of the previous aspects, the plurality of drill cuttings are rinsed and at least partially dried to remove excess fluid from an outer surface of the plurality of drill cuttings prior to step (i).

In another aspect combinable with any of the previous aspects, each of the plurality of drill cuttings or each of the plurality of crushed rock pieces have an outer dimension in a range of between 0.5 and 3 mm.

In another aspect combinable with any of the previous aspects, step (iii) includes measuring the volume of the solid matrix of the processed rock sample using the gas porosimeter using a Boyle's law technique with an inert gas.

In another aspect combinable with any of the previous aspects, the inert gas includes at least one of nitrogen, helium, or argon.

In another aspect combinable with any of the previous aspects, step (ii) includes measuring, using NMR, the volume of the fluid entrained within the solid matrix with at least one of $T_1$ or $T_2$ measurements of the processed rock sample.

In another aspect combinable with any of the previous aspects, step (ii) includes determining a density of the fluid entrained within the solid matrix; and determining a porosity of the fluid entrained within the solid matrix based on the determined volume of the liquid and a volume of the processed rock sample.

In another aspect combinable with any of the previous aspects, determining the density of the fluid entrained within the solid matrix includes identifying a type of the fluid based on the NMR measurements; and determining the density of the fluid based on the identified type of the fluid.

In another aspect combinable with any of the previous aspects, step (v) includes determining the grain density of the processed rock sample based on the measured mass of the processed rock sample, the density of the fluid, the volume of the solid matrix, and the volume of the fluid entrained in the solid matrix.

In another aspect combinable with any of the previous aspects, determining the grain density of the processed rock sample based on the mass of the processed rock sample, the density of the fluid, the volume of the solid matrix, and the volume of the fluid entrained in the solid matrix includes determining the grain density of the processed rock sample from:

$$\rho_g = \frac{M - V_{NMR} * \rho_{liq}}{V_g - V_{NMR}},$$

where $\rho_g$ is the grain density of the processed rock sample, M is the measured mass of the processed rock sample, $\rho_{liq}$ is the density of the fluid entrained within the solid matrix, $V_{NMR}$ is the volume of the fluid entrained in the solid matrix, and $V_g$ is the volume of the solid matrix.

In another aspect combinable with any of the previous aspects, step (v) includes determining the porosity of the processed rock sample based on the bulk volume, the volume of the solid matrix, and the volume of the fluid entrained in the solid matrix.

In another aspect combinable with any of the previous aspects, determining the porosity of the processed rock sample based on the bulk volume, the volume of the solid matrix, and the volume of the fluid entrained in the solid matrix includes determining the porosity of the processed rock sample from:

$$\phi = \frac{V_g - V_{NMR}}{V_b},$$

where $\Phi$ is the porosity of the processed rock sample, $V_{NMR}$ is the volume of the fluid entrained in the solid matrix, $V_g$ is the volume of the solid matrix, and $V_b$ is the bulk volume.

In another aspect combinable with any of the previous aspects, step (v) includes determining the bulk density of the processed rock sample based on the mass of the processed rock sample, the density of the fluid, the bulk volume, and the volume of the fluid entrained in the solid matrix.

In another aspect combinable with any of the previous aspects, determining the bulk density of the processed rock sample based on the mass of the processed rock sample, the density of the fluid, the bulk volume, and the volume of the fluid entrained in the solid matrix includes determining the bulk density of the processed rock sample from:

$$\rho_g = \frac{M - V_{NMR} * \rho_{liq}}{V_g - V_{NMR}},$$

where $\rho_b$ is the bulk density of the processed rock sample, M is the measured mass of the processed rock sample, $\rho_{liq}$ is the density of the fluid entrained within the solid matrix, $V_{NMR}$ is the volume of the fluid entrained in the solid matrix, and $V_b$ is the bulk volume.

In another example implementation, a system for determining a geologic property of a rock sample includes a gas porosimeter configured to determine a grain volume of a solid matrix of a processed rock sample that includes the solid matrix and a fluid entrained within the solid matrix; a scale configured to measure a mass of the processed rock sample; a nuclear magnetic resonance (NMR) measurement device configured to determine one or more NMR measurements of the processed rock sample; a mercury immersion porosimeter configured to determine a bulk volume of the processed rock sample; and a control system configured to perform operations. The operation include (1) determining a volume of the fluid entrained within the solid matrix from the NMR measurements; (2) identifying the determined grain density of the processed rock sample from the gas porosimeter and the mass of the processed rock sample from the scale; (3) identifying the determined bulk volume of the processed rock sample with the mercury immersion porosimeter; and (4) determining, based at least one on the determined volume of the fluid, the determined volume of the solid matrix, and the determined bulk volume, at least one of a bulk density, a grain density, or a porosity of the processed rock sample.

In an aspect combinable with the example implementation, the processed rock sample is free from chemical cleaning subsequent to removal of the processed rock sample from a subterranean formation.

In another aspect combinable with any of the previous aspects, the processed rock sample includes a plurality of drill cuttings or a plurality of crushed rock pieces.

In another aspect combinable with any of the previous aspects, the plurality of drill cuttings are rinsed and at least partially dried to remove excess fluid from an outer surface of the plurality of drill cuttings.

In another aspect combinable with any of the previous aspects, each of the plurality of drill cuttings or each of the plurality of crushed rock pieces have an outer dimension in a range of between 0.5 and 3 mm.

In another aspect combinable with any of the previous aspects, step (iii) includes measuring the volume of the solid matrix of the processed rock sample using the gas porosimeter using a Boyle's law technique with an inert gas.

In another aspect combinable with any of the previous aspects, the inert gas includes at least one of nitrogen, helium, or argon.

In another aspect combinable with any of the previous aspects, the operation of (1) includes measuring, using NMR, the volume of the fluid entrained within the solid matrix with at least one of $T_1$ or $T_2$ measurements of the processed rock sample.

In another aspect combinable with any of the previous aspects, the operation of (1) includes determining a density of the fluid entrained within the solid matrix; and determining a porosity of the fluid entrained within the solid matrix based on the determined volume of the liquid and a volume of the processed rock sample.

In another aspect combinable with any of the previous aspects, the operation of determining the density of the fluid entrained within the solid matrix includes identifying a type of the fluid based on the NMR measurements; and determining the density of the fluid based on the identified type of the fluid.

In another aspect combinable with any of the previous aspects, the operation of (4) includes determining the grain density of the processed rock sample based on the mass of the processed rock sample, the density of the fluid, the volume of the solid matrix, and the volume of the fluid entrained in the solid matrix.

In another aspect combinable with any of the previous aspects, the operation of determining the grain density of the processed rock sample based on the mass of the processed rock sample, the density of the fluid, the volume of the solid matrix, and the volume of the fluid entrained in the solid matrix includes determining the grain density of the processed rock sample from:

$$\rho_g = \frac{M - V_{NMR} * \rho_{liq}}{V_g - V_{NMR}},$$

where $\rho_g$ is the grain density of the processed rock sample, M is the mass of the processed rock sample, $\rho_{liq}$ is the density of the fluid entrained within the solid matrix, $V_{NMR}$ is the volume of the fluid entrained in the solid matrix, and $V_g$ is the volume of the solid matrix.

In another aspect combinable with any of the previous aspects, the operation (4) includes determining the porosity of the processed rock sample based on the bulk volume, the volume of the solid matrix, and the volume of the fluid entrained in the solid matrix.

In another aspect combinable with any of the previous aspects, the operation of determining the porosity of the processed rock sample based on the bulk volume, the volume of the solid matrix, and the volume of the fluid entrained in the solid matrix includes determining the porosity of the processed rock sample from:

$$\phi = \frac{V_g - V_{NMR}}{V_b},$$

where $\Phi$ is the porosity of the processed rock sample, $V_{NMR}$ is the volume of the fluid entrained in the solid matrix, $V_g$ is the volume of the solid matrix, and $V_b$ is the bulk volume.

In another aspect combinable with any of the previous aspects, the operation of (4) includes determining the bulk density of the processed rock sample based on the mass of the processed rock sample, the density of the fluid, the bulk volume, and the volume of the fluid entrained in the solid matrix.

In another aspect combinable with any of the previous aspects, the operation of determining the bulk density of the processed rock sample based on the mass of the processed rock sample, the density of the fluid, the bulk volume, and the volume of the fluid entrained in the solid matrix includes determining the bulk density of the processed rock sample from:

$$\rho_b = \frac{M - V_{NMR} * \rho_{liq}}{V_g - V_{NMR}},$$

where $\rho_b$ is the bulk density of the processed rock sample, M is the mass of the processed rock sample, $\rho_{liq}$ is the density of the fluid entrained within the solid matrix, $V_{NMR}$ is the volume of the fluid entrained in the solid matrix, and $V_b$ is the bulk volume.

In another example implementation, a computer-implemented method performed with a computing system that includes one or more hardware processors includes determining, with the one or more hardware processors, a mass of a processed rock sample; determining, with the one or more hardware processors, a volume of fluid entrained within a solid matrix of the processed rock sample based on one or more measurements of nuclear magnetic resonance (NMR); determining, with the one or more hardware processors, a volume of the solid matrix of the processed rock sample based on one or more measurements of a gas porosimeter; determining, with the one or more hardware processors, a bulk volume of the processed rock sample based on one or more measurements of a mercury immersion porosimeter; and determining, with the one or more hardware processors, at least one of a bulk density, a grain density, or a porosity of the processed rock sample based on at least the determined volume of the fluid, the determined volume of the solid matrix, and the determined bulk volume.

In an aspect combinable with the example implementation, the processed rock sample is free from chemical cleaning subsequent to removal of the processed rock sample from a subterranean formation.

In another aspect combinable with any of the previous aspects, the processed rock sample includes a plurality of drill cuttings or a plurality of crushed rock pieces.

In another aspect combinable with any of the previous aspects, the plurality of drill cuttings are rinsed and at least partially dried to remove excess fluid from an outer surface of the plurality of drill cuttings.

In another aspect combinable with any of the previous aspects, each of the plurality of drill cuttings or each of the plurality of crushed rock pieces have an outer dimension in a range of between 0.5 and 3 mm.

In another aspect combinable with any of the previous aspects, determining the solid matrix includes measuring the volume of the solid matrix of the processed rock sample using the gas porosimeter using a Boyle's law technique with an inert gas.

In another aspect combinable with any of the previous aspects, the inert gas includes at least one of nitrogen, helium, or argon.

In another aspect combinable with any of the previous aspects, determining the volume of the fluid includes measuring, using NMR, the volume of the fluid entrained within the solid matrix with at least one of $T_1$ or $T_2$ measurements of the processed rock sample.

In another aspect combinable with any of the previous aspects, determining the volume of the fluid includes determining a density of the fluid entrained within the solid matrix; and determining a porosity of the fluid entrained within the solid matrix based on the determined volume of the liquid and a volume of the processed rock sample.

Another aspect combinable with any of the previous aspects further includes determining, with the one or more hardware processors, the grain density of the processed rock sample based on the mass of the processed rock sample, the density of the fluid, the volume of the solid matrix, and the volume of the fluid entrained in the solid matrix.

In another aspect combinable with any of the previous aspects, determining the grain density of the processed rock sample based on the mass of the processed rock sample, the density of the fluid, the volume of the solid matrix, and the volume of the fluid entrained in the solid matrix includes determining the grain density of the processed rock sample from:

$$\rho_g = \frac{M - V_{NMR} * \rho_{liq}}{V_g - V_{NMR}},$$

where $\rho_g$ is the grain density of the processed rock sample, M is the mass of the processed rock sample, $\rho_{liq}$ is the density of the fluid entrained within the solid matrix, $V_{NMR}$ is the volume of the fluid entrained in the solid matrix, and $V_g$ is the volume of the solid matrix.

Another aspect combinable with any of the previous aspects further includes determining, with the one or more hardware processors, the porosity of the processed rock sample based on the bulk volume, the volume of the solid matrix, and the volume of the fluid entrained in the solid matrix.

In another aspect combinable with any of the previous aspects, determining the porosity of the processed rock sample based on the bulk volume, the volume of the solid matrix, and the volume of the fluid entrained in the solid matrix includes determining the porosity of the processed rock sample from:

$$\phi = \frac{V_g - V_{NMR}}{V_b},$$

where $\Phi$ is the porosity of the processed rock sample, $V_{NMR}$ is the volume of the fluid entrained in the solid matrix, $V_g$ is the volume of the solid matrix, and $V_b$ is the bulk volume.

Another aspect combinable with any of the previous aspects further includes determining, with the one or more hardware processors, the bulk density of the processed rock sample based on the mass of the processed rock sample, the density of the fluid, the bulk volume, and the volume of the fluid entrained in the solid matrix.

In another aspect combinable with any of the previous aspects, determining the bulk density of the processed rock sample based on the mass of the processed rock sample, the density of the fluid, the bulk volume, and the volume of the fluid entrained in the solid matrix includes determining the bulk density of the processed rock sample from:

$$\rho_b = \frac{M - V_{NMR} * \rho_{liq}}{V_g - V_{NMR}},$$

where $\rho_b$ is the bulk density of the processed rock sample, M is the mass of the processed rock sample, $\rho_{liq}$ is the density of the fluid entrained within the solid matrix, $V_{NMR}$ is the volume of the fluid entrained in the solid matrix, and $V_b$ is the bulk volume.

Implementations of systems and methods for determining geologic properties of a rock sample according to the present disclosure may include one or more of the following features. For example, implementations according to the present disclosure may more accurately determine grain density of a rock sample by determining grain density of a solid portion (for example, solid matrix) of the rock sample exclusive of any entrained fluid within the rock sample. As another example, implementations according to the present disclosure may determine such accurate grain density of a rock that is not chemically cleaned (and possibly completely dried) rock sample as required in conventional techniques. As another example, implementations according to the present disclosure may therefore save time conventionally spent chemically cleaning such sample but also allows measurement without possible chemical alteration to the sample.

The details of one or more implementations of the subject matter described in this disclosure are set forth in the accompanying drawings and the description below. Other features, aspects, and advantages of the subject matter will become apparent from the description, the drawings, and the claims.

DETAILED DESCRIPTION

Figure 1A:
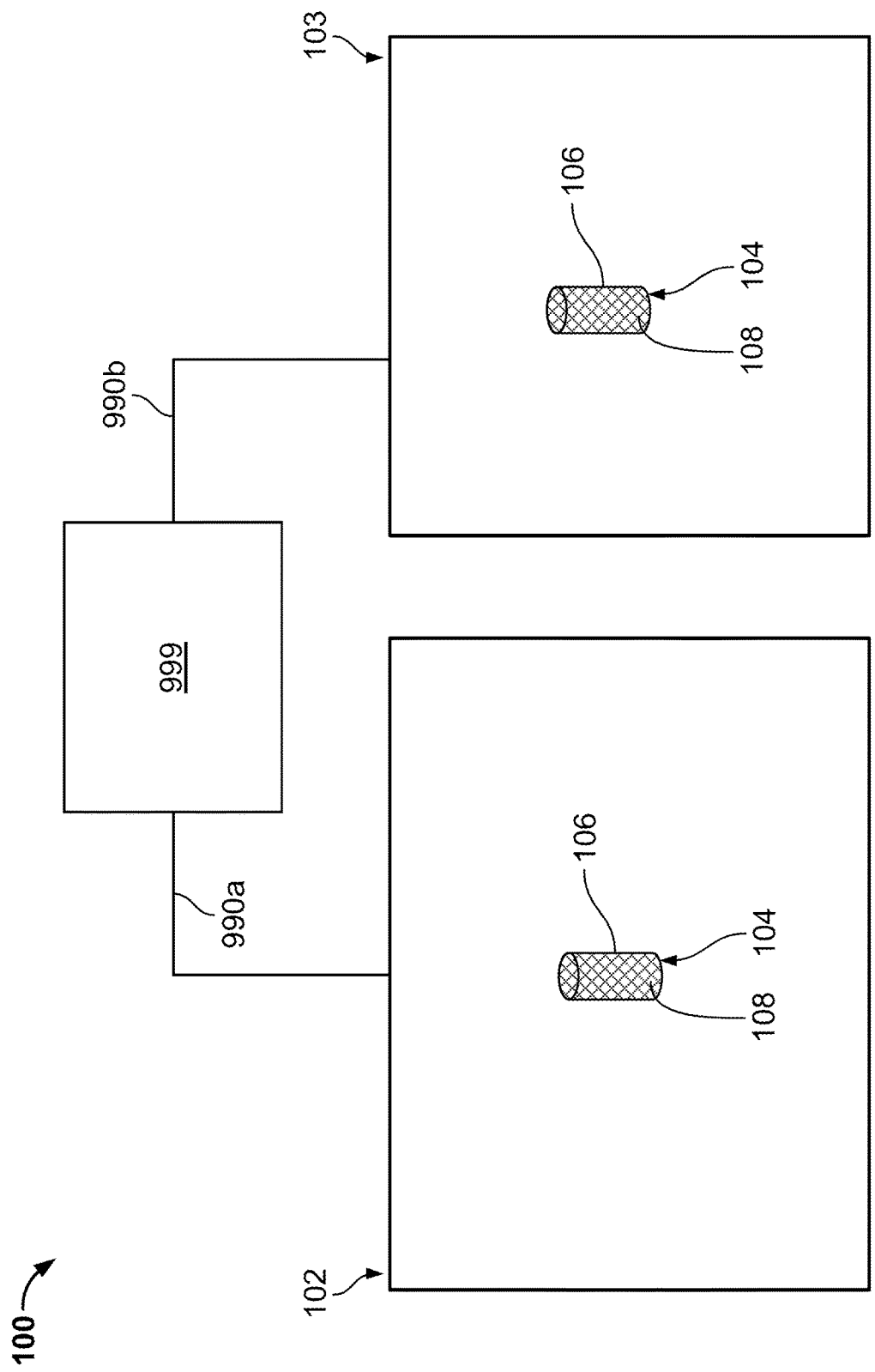
FIGS. 1A-1B are schematic diagrams of an example implementation of a system for determining geologic properties of a rock sample according to the present disclosure.

The present disclosure describes example implementations of systems and methods for determining geologic properties of a rock sample such as porosity, bulk density, and grain density of a solid matrix portion of the rock sample. Grain density, also known as matrix density, of a rock sample refers to a density of the solid matrix of the rock sample, which, as a whole, can include the solid matrix as well as a fluid (for example, liquid, mixed phase fluid, gas) that is entrained within the solid matrix due to the porosity of the solid matrix. In example implementations according to the present disclosure, the described systems and methods can determine such geologic properties of a processed, but chemically untreated and/or dried rock sample, such as a rock sample taken from a subterranean formation that has not been chemically cleaned or otherwise completely (external surfaces and internal pores) dried. In some aspects according to the present disclosure, a processed rock sample can have been externally cleaned of drilling fluid (if applicable, such as with drill cuttings) and dried such that little to no excess liquid remains on external surfaces of the processed rock sample. However, the processed rock sample is not completely dry in that some reservoir fluid (or other fluid) can be entrained internally within the solid matrix of the sample. In some aspects, the processed rock sample can be a core sample. In some aspects, the processed rock sample can be drill cuttings. In some aspects, the processed rock sample can be crushed portions of rock from a subterranean formation (for example, a core that has been crushed into pieces and then cleaned and dried).

Example implementations according to the present disclosure can combine multiple measurements to accurately determine the rock properties of porosity, bulk density, and grain density from a sample that has not been chemically cleaned or saturated with a liquid (such as diesel fuel). The bulk density can be defined as a density of the total rock including the pore spaces within a processed rock sample. However, the fluid included in the pores of the processed rock sample may not be included. To correct for the residual fluid in a processed rock sample (for example, especially from an unconventional reservoir), measurements from nuclear magnetic resonance can be used to determine an amount of fluid in the processed rock sample. Such measurements can then be used to correct bulk volumetric measurements obtained using, for example, mercury immersion porosimetry and mass balance.

In some aspects, grain density of a processed rock sample is the density of all the solid components in the sample, in other words, the solid matrix of the sample. When measuring this parameter using gas porosimetry, the remaining liquid in the processed rock sample can end up contributing to the measurement and lead to an incorrect grain density measurement. The same is true for the porosity measurement, where some of the void space is filled with fluid and therefore not measured. Example implementations of the present disclosure can use NMR measurements to solve this issue by measuring the remaining fluid using NMR and adjusting the measured values from gas porosimetry as described herein.

Figure 1B:
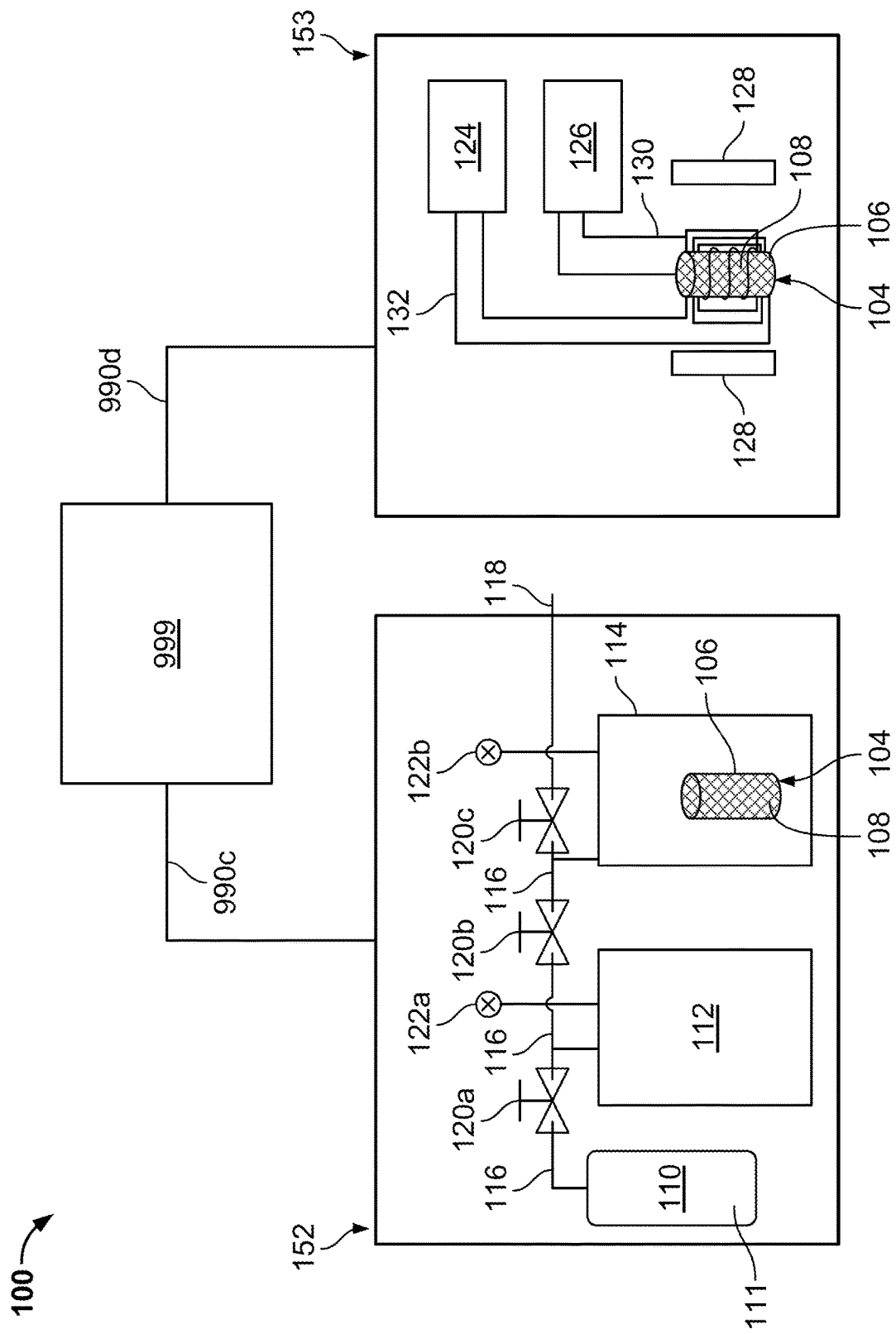

FIGS. 1A-1B illustrate (in combination) a schematic diagram of an example implementation of a system 100 for determining one or more geologic properties of a processed rock sample 104 according to the present disclosure. Generally, the system 100 (and associated process of operation of the system 100) can be used to accurately determine properties of the processed rock sample 104 from gas porosimetry measurements, nuclear magnetic resonance (NMR) measurements, and mercury immersion porosity measurements to determine particular parameters of the processed rock sample 104.

As noted, the processed rock sample 104 need not be chemically cleaned in order for the gas porosimetry, mercury immersion porosimetry, and NMR measurements to proceed. In the present disclosure, for example, chemical cleaning can refer to one or more processes of using a solvent, typically chloroform, toluene, ethanol, dichloromethane, or a combination of these or other chemicals, to dissolve and remove trapped fluids within a rock sample (also referred to as a core sample). This can be done using a variety of methods (for example, Dean Stark and Soxhlet extraction). The processed rock sample 104 of the present disclosure, however, can be a core sample (for example, a cylindrical rock sample of about 1 inch in diameter and 1 inch in length), drill cuttings, and/or crushed pieces from a rock sample from a subterranean formation.

In some aspects, such as when the processed rock sample 104 is comprised of drill cuttings or crushed pieces, each cutting or piece can be constrained to a size (for example, diameter) of between 0.5 and 3 mm. Thus, the processed rock sample 104 (as drill cuttings or crushed pieces, can be sieved to such a specific size to avoid fine grain particles, which may cause measurement issues in the system 100.

In some examples, the processed rock sample 104 is cleaned of an external liquid, such as drilling mud (for example, in the case of drill cuttings or other pieces). The cleaning can be done using a fluid similar to the drilling mud. For example, if a water-based drilling mud is used, then water can be used to rinse the cuttings or pieces to arrive at the processed rock sample 104 with little to no drilling mud on the exterior. In some aspects, the rinsed cuttings or pieces can be sieved to provide for a particular minimum size (for example, volume) of cuttings or pieces to arrive at the processed rock sample 104. In some aspects, excess external fluid on the processed rock sample 104 can be removed, such as by placing the cleaned sample in a vacuum oven and drying at a temperature appropriate for the fluid used. If water is used, drying the samples at 110-125° C. overnight should remove all external fluid. However, this optional drying process does not remove all the fluids inside the rock sample 104 (in other words, fluid that is entrained in a solid matrix of the rock sample 104).

The processed rock sample 104 is formed of a solid matrix 106 and a fluid 108 that is entrained within the solid matrix 106. In some aspects, the fluid 108 is a hydrocarbon fluid, such as oil, gas, a mixture thereof, or a mixture of hydrocarbon fluids and non-hydrocarbon fluids (for example, water). The fluid 108 is often in liquid state, but can also be a pure gas or mixed-phase fluid.

FIGS. 1A and 1B show an example implementation of the system 100 that includes a scale 102 (to measure a mass, in grams, of the processed rock sample 104), a mercury immersion porosimeter 103, a gas porosimeter 152, and an NMR measurement device (or system) 153. In these figures, the same processed rock sample 104 is shown at each component and, as explained herein, the same processed rock sample 104 can be measured by each component sequentially (in no particular order) in order to determine one or more geologic properties of the processed rock sample 104.

As shown, a control system 999 is communicably coupled (optionally) to the scale 102 through data connection 990a (wired or wireless), to the mercury immersion porosimeter 103 through data connection 990b (wired or wireless), to the gas porosimeter 152 by a data connection 990c (wired or wireless), and the NMR measurement device 153 through data connection 990d (wired or wireless). The control system 999, in some embodiments, can be implemented as a micro-processor based controller system (or multiple control systems, or controllers, communicably coupled together). However, the control system 999 can be implemented as a mechanical, electro-mechanical, or pneumatic control system, or a combination thereof.

Scale 102 can be operated (for example, by the control system 999 or otherwise) to measure a mass (in grams) of the processed rock sample 104. In some aspects, multiple measurements can be taken and stored (even if just transiently) in the control system 999. The scale 102 can be digital or analog (such as a scale).

The mercury immersion porosimeter 103 can be operated (for example, by the control system 999 or otherwise and as a last step) to measure a bulk volume ($V_b$) (in cubic millimeters) of the processed rock sample 104. In some aspects, the mercury immersion porosimeter 103 can be an Anton Paar Pore Master.

As shown in FIG. 1b, the system 100 includes the gas porosimeter 152 in which the processed rock sample 104 can be placed and analyzed to determine an overall grain volume ($V_g$) of the processed rock sample 104 as a whole (in other words, a grain volume of the processed rock sample 104 that accounts for both the solid matrix 106 as well as the fluid 108 rather than a grain volume of the solid matrix 106 alone). In this example, the gas porosimeter 152 is a Boyle's law gas porosimeter; however, the present disclosure contemplates that any appropriate gas porosimeter that can determine a grain volume of the processed rock sample 104, as a whole, can be used.

The illustrated gas porosimeter 152 includes a source 110 of a pressurized gas 111. In some aspects, the pressurized gas 111 comprises an inert gas, such as helium, nitrogen, argon, or a combination thereof (or other gas). As shown, the source 110 is fluidly coupled to a reference test cell 112 and a sample test cell 114 (in which the processed rock sample 104 is placed). A number of interconnected conduits 116 (for example, tubing, piping, or other conduits that create fluid flow paths) fluidly connect the source 110, the reference test cell 112, and the sample test cell 114.

Coupled within the conduits 116, in this example implementation, are valves 120a-120c (for example, zero displacement volume ball valves). Other valves can also be included within the gas porosimeter 152. Generally, the valves 120a-120c are controllable (for example, manually or by a control system 999 as described in more detail later) to flow the pressurized gas 111 from the source 110 into the reference test cell 112 and the sample test cell 114. The valves 120a-120c are also controllable to seal a particular volume or amount of the pressurized gas 111 within the reference test cell 112 or the sample test cell 114 (or both).

Also coupled within the conduits 116, in this example implementation, are pressure gauges (or sensors) 122a and 122b. In this example, pressure gauge 122a can measure a pressure of the reference test cell 112 (or more specifically, a pressure of the pressurized gas 111 contained within the reference test cell 112).

Although shown schematically as contained within the gas porosimeter 152, one or more components of the gas porosimeter 152 can be contained in a housing or container, while other components are located external to such housing or container. For example, the illustrated components except for the source 110 of the pressurized gas 111 can be contained in a housing or incubator. Further, within such a container or incubator, the illustrated components (for example, the reference test cell 112, the sample test cell 114, one or more of the valves 120a-120c, and one or more of the pressure gauges 122a-122b) can be placed into a liquid-filled container, which can, for example, establish an isothermal environment for the reference test cell 112 and the sample test cell 114.

In this example of the gas porosimeter 152, the grain volume of the processed rock sample 104 can be determined according to Boyle's law (or by the Boyle's law technique). Boyle's law states that that a pressure (P) of a given quantity of gas varies inversely with its volume (V) at constant temperature (for example, under isothermal conditions). In this example, the grain volume of the processed rock sample 104 (as a whole) can be measured by determining a volume of the processed rock sample 104 within the sample test cell 114 with reference to a known volume of the reference test cell 112 (and measured pressures in each cell). For example, the pressurized gas 111 is introduced into the reference test cell 112 and sealed there within (for example, with valves 120a and 120b). A pressure of the reference test cell 112 is measured by the pressure gauge 122a to determine a reference pressure (Pr). The valve 120b is then opened to fluidly connect the reference test cell 112 to the sample test cell 114 and allow molecules of the pressurized gas 111 from the reference test cell 112 to be forced into the processed rock sample 104. The pressure of the sample test cell 114 ($P_s$) is then recorded by the pressure gauge 122b. Based on the measured pressures ($P_r$ and $P_s$). Grain volume of the processed rock sample 104 can be calculated based on the known volumes of the reference test cell 112 and the sample test cell 114 and a ratio of the measured pressures.

The control system 999, in this example implementation, is communicably coupled through data connection 990c to one or more components of the gas porosimeter 152, such as the valves 120a-120c (and other valves or flow control devices, not shown) and the pressure gauges 122a-122b. For example, control instructions can be provided through data connection 990c from the control system 999 to one or more of the valves 120a-120c (for example, instructions to open, close, or modulate between open and closed). As another example, measured data can be provided through data connection 990c from the pressure gauges 122a-122b to the control system 999 (for example, pressure data measured on command or periodically, or both). Thus, operations of the gas porosimeter 152 described previously can be implemented or controlled by the control system 999 through data connection 990c.

As further shown in the example system 100, the NMR measurement device (or system) 153 is also included and operable to measure a volume ($V_{NMR}$) of the fluid 108 entrained in the processed rock sample 104. The NMR measurements can be used to correct the measured grain volume of the processed rock sample 104 from the gas porosimeter 152 in order to determine a grain volume of the solid matrix 106 (exclusive of the fluid 108) of the processed rock sample 104.

The example implementation of the NMR device 153 includes a magnet 128 that is positionable about the processed rock sample 104 and controllable to produce a homogeneous magnetic field around the processed rock sample 104. A radio frequency (RF) transmitter 124 includes a coil 132 that is wound about the processed rock sample 104 and produces an electromagnetic radiation about the processed rock sample 104. An RF receiver 126 includes a coil 130 that is operable to detect signals produced by a resonating nuclei of the processed rock sample 104. In this example, the control system 999 (or part of the control system) is communicably coupled to the NMR device 153 through data communication 990d (wired or wirelessly).

In operation, the processed rock sample 104 can be placed in the NMR device 153 (for example, prior to the measurement of grain volume of the sample 104 by the gas porosimeter 152). The magnet 128 is operated (for example, energized by the control system 999) to produce the magnetic field about the processed rock sample 104. The NMR active nuclei in the processed rock sample 104 each has a magnetic moment, which collectively combine to form a net macroscopic magnetization vector that is aligned with the static magnetic field generated by the magnet 128. Next, electric currents are generated in the coil 132 of the RF transmitter 124 (as controlled, for example, by the control system 999) to form a secondary oscillating magnetic field about the processed rock sample 104. This causes the macroscopic magnetization to rotate (for example, 90°) into a particular planar field (for example, x-y plane). After excitation, the net macroscopic magnetization processes around the primary static magnetic field and returns to, for example, a vertical plane (z plane). Weak currents (decay) are induced and measured in the coil 130 of the RF receiver 126 (and provided to the control system 999 through data communication 990d). The measured decay current, also called a resonance signal or Free Induction Decay (FID), can be recorded as a function of time.

Further NMR measurements can be taken, such as relaxation times, $T_1$ (longitudinal relaxation times, which is the time constant which determines the rate at which excited protons in the processed rock sample 104 return to equilibrium) and $T_2$ (transverse relaxation time, which is a time constant which determines the rate at which excited protons in the processed rock sample 104 reach equilibrium or go out of phase with each other). In some aspects, one or more of the NMR measurements (FID, $T_1$, and/or and $T_2$) can be used (for example, by the control system 999) to determine, for example, a volume of the fluid 108 in the processed rock sample 104. For example, in some aspects, the $T_1$ or $T_2$ values are not directly used to measure the volume of fluid 108 entrained in the solid matrix 106 but, instead, the volume ($V_{NMR}$) is obtained from the overall NMR signal or the integration of the acquired $T_1$ or $T_2$ spectrum on the processed rock sample 104.

Figure 2:
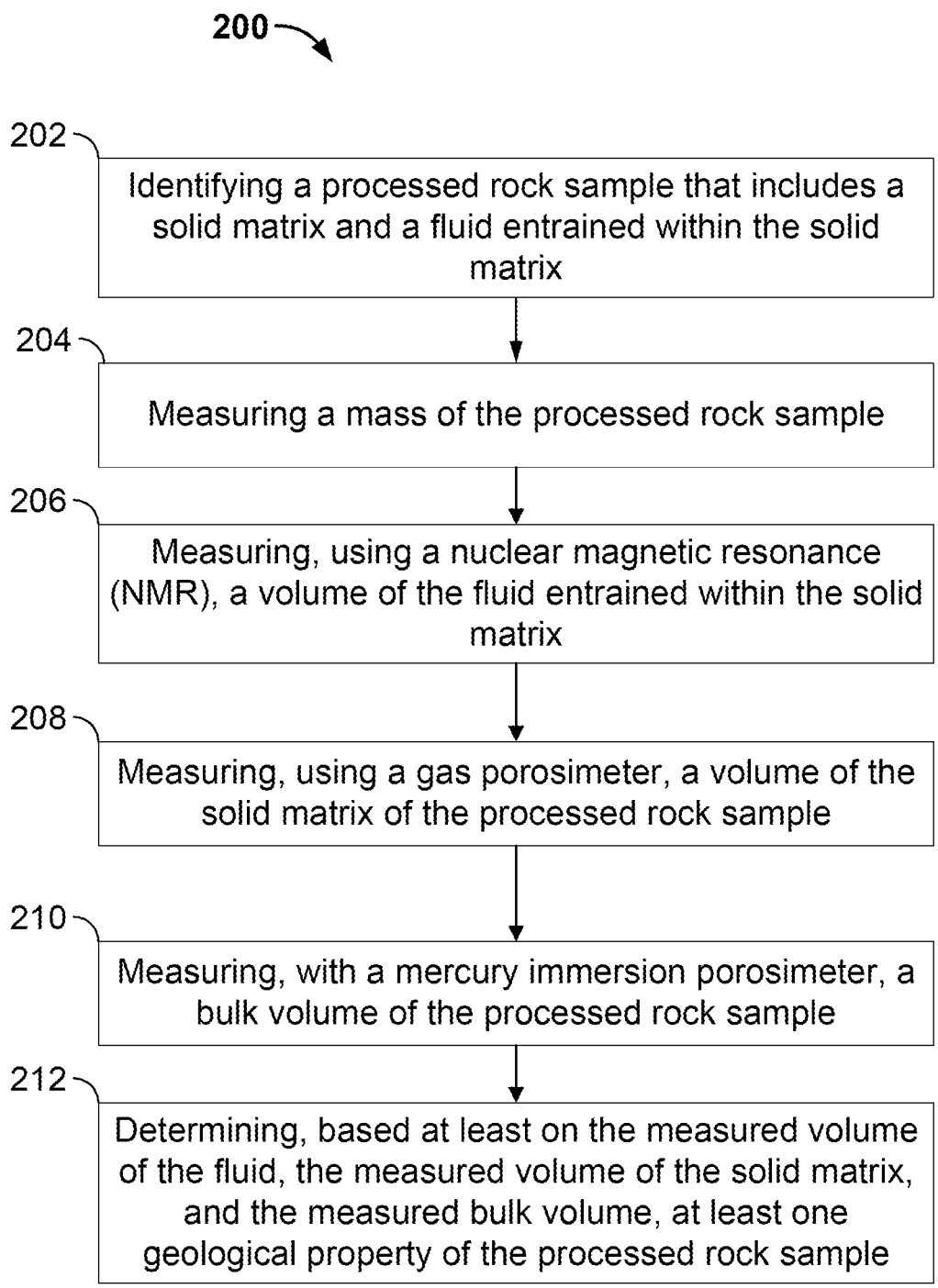
FIG. 2 is a flowchart that describes an example method for determining geologic properties of a rock sample according to the present disclosure.

FIG. 2 is a flowchart that describes an example method 200 for determining one or more geologic properties, such as porosity, bulk density, and grain density, of a rock sample according to the present disclosure. For example, method 200 can be performed with or by the system 100 shown in FIGS. 1A-1B, including, for example, one or more steps performed with or by the control system 999. Method 200 can begin at step 202, which includes identifying a processed rock sample that includes a solid matrix and a fluid entrained within the solid matrix. For example, a processed rock sample can be removed from a subterranean formation, such as through a drilled wellbore, for analysis by system 100. The processed rock sample, such as drill cuttings, crushed pieces, or a core, is formed from a solid matrix and also includes a fluid, such as a liquid, entrained within pores of the processed rock sample that are formed by the solid matrix. The processed rock sample can be cleaned and externally dried (as previously described) but otherwise untreated in that no chemical cleaning or drying of the processed rock sample has taken place subsequent to its removal from the subterranean formation. In some aspects, the processed rock sample can be taken from an unconventional reservoir, such as shale or other tight rock formations (in contrast to traditional sandstone formations).

Method 200 can continue at step 204, which includes measuring a mass of the processed rock sample. For example, the mass (for example, in grams) can be measured by a scale (for example, scale 102) or balance or other appropriate measurement device. In some aspects, prior to determining the mass of the processed rock sample, the sample (for example, in the case of drill cuttings or crushed pieces) can be sieved to a particular size to ensure that fines or particles that are too small are removed from the sample. The measured mass of the processed rock sample can be stored, for example, in control system 999.

Method 200 can continue at step 206, which includes measuring, using a nuclear magnetic resonance (NMR), a volume of the fluid entrained within the solid matrix. For example, the processed rock sample can be placed in the NMR device 153 in order to measure a volume of the fluid (for example, liquid) entrained in the solid matrix of the processed rock sample as previously described with reference to system 100 in FIGS. 1A-1B. Subsequent to step 206, therefore, a control system (such as control system 999) implementing all or a portion of method 200 can store the measured fluid volume, $V_{NMR}$, of the processed rock sample according to the NMR measurements.

In some aspects, step 206 can include measuring the volume of the fluid entrained within the solid matrix with at least one of $T_1$ or $T_2$ NMR measurements (and preferably, in some examples, $T_2$ measurements). Along with the NMR measurements, in some cases, determining the volume of the fluid includes estimating a density of the fluid entrained within the solid matrix based on the cleaning fluid used to clean the outer surface of the processed rock sample (for example, in the case of drill cuttings). If water is used as a cleaning agent, 1 g/mL can be used as an estimate. In some cases, such as for a core or crushed pieces of a core, the estimate of fluid density can be estimated by the known reservoir fluid density (or for typical oil/water cuts, between 0.8 and 1 g/mL can be appropriate). In some aspects, step 206 also includes determining a porosity of the fluid entrained within the solid matrix based on the determined volume of the liquid and a volume of the processed rock sample. In some aspects, the density of the entrained fluid can be determined by identifying the type of fluid within the processed rock sample based on the NMR measurements (for example, $T_2$ relaxation values).

Method 200 can continue at step 208, which includes measuring, using a gas porosimeter, a volume of the solid matrix of the processed rock sample. For example, the processed rock sample can be placed in the gas porosimeter 152, such as a Boyle's law dual cell gas porosimeter, in order to measure a grain volume of the processed rock sample (as a whole, including the solid matrix and entrained fluid) as previously described with reference to system 100. Subsequent to step 208, therefore, a control system (such as control system 999) implementing all or a portion of method 200 can store the measured grain volume, $V_g$, of the processed rock sample according to gas porosimetry.

Method 200 can continue at step 210, which includes measuring, with a mercury immersion porosimeter, a bulk volume of the processed rock sample. For example, the mercury immersion porosimeter 103 of system 100 can measure the bulk volume, $V_B$, of the processed rock sample. Subsequent to step 210, therefore, a control system (such as control system 999) implementing all or a portion of method 200 can store the measured bulk volume of the processed rock sample.

Method 200 can continue at step 212, which includes determining, based at least on the measured volume of the fluid, the measured volume of the solid matrix, and the measured bulk volume, at least one geologic property of the processed rock sample. For example, geologic properties that can be determined include at least one of porosity, bulk density, or grain density. In some aspects, step 212 can be performed with the control system 999 of system 100. In some aspects, step 212 can include determining each of porosity, bulk density, or grain density.

For example, step 212 can include determining the grain density of the processed rock sample based on the measured mass of the processed rock sample, the density of the fluid, the volume of the solid matrix, and the volume of the fluid entrained in the solid matrix. For example, these measured values can be used to determine the grain density of the processed rock sample according to:

$$\rho_g = \frac{M - V_{NMR} * \rho_{liq}}{V_g - V_{NMR}},\qquad \text{Eq. 1.}$$

In Eq. 1, $\rho_g$ is the grain density of the processed rock sample, M is the measured mass of the processed rock sample, $\rho_{liq}$ is the density of the fluid entrained within the solid matrix (estimated or measured by NMR), $V_{NMR}$ is the volume of the fluid entrained in the solid matrix, and Ig is the volume of the solid matrix.

Step 212 can also include determining the porosity of the processed rock sample based on the bulk volume, the volume of the solid matrix, and the volume of the fluid entrained in the solid matrix. For example, these measured values can be used to determine the porosity of the processed rock sample according to:

$$\phi = \frac{V_g - V_{NMR}}{V_b},\qquad \text{Eq. 2.}$$

In Eq. 2, $\Phi$ is the porosity of the processed rock sample, $V_{NMR}$ is the volume of the fluid entrained in the solid matrix, $V_g$ is the volume of the solid matrix, and $V_b$ is the bulk volume.

Step 212 can also include determining the bulk density of the processed rock sample based on the mass of the processed rock sample, the density of the fluid, the bulk volume, and the volume of the fluid entrained in the solid matrix. For example, these measured values can be used to determine the bulk density of the processed rock sample according to:

$$\rho_b = \frac{M - V_{NMR} * \rho_{liq}}{V_g - V_{NMR}},\qquad \text{Eq. 3.}$$

In Eq. 3, $\rho_b$ is the bulk density of the processed rock sample, M is the measured mass of the processed rock sample, $\rho_{liq}$ is the density of the fluid entrained within the solid matrix, $V_{NMR}$ is the volume of the fluid entrained in the solid matrix, and $V_b$ is the bulk volume.

Additional steps can be included in method 200. For example, method 200 can also include determining a characteristic of the processed rock sample or the subterranean formation (or both) based on the determined grain density of the solid matrix. For example, several characteristics of the processed rock sample or a subterranean formation from which the processed rock sample was obtained can be determined once the grain density of the solid matrix. For example, a rock type of the processed rock sample, a reservoir type of the subterranean formation, or a formation porosity of the subterranean formation can be determined or estimated based on the determined grain density of the solid matrix of the processed rock sample. Such information can be used, for example, to guide hydraulic fracturing operations and decisions, as well as other completion decisions of a reservoir.

Figure 3:
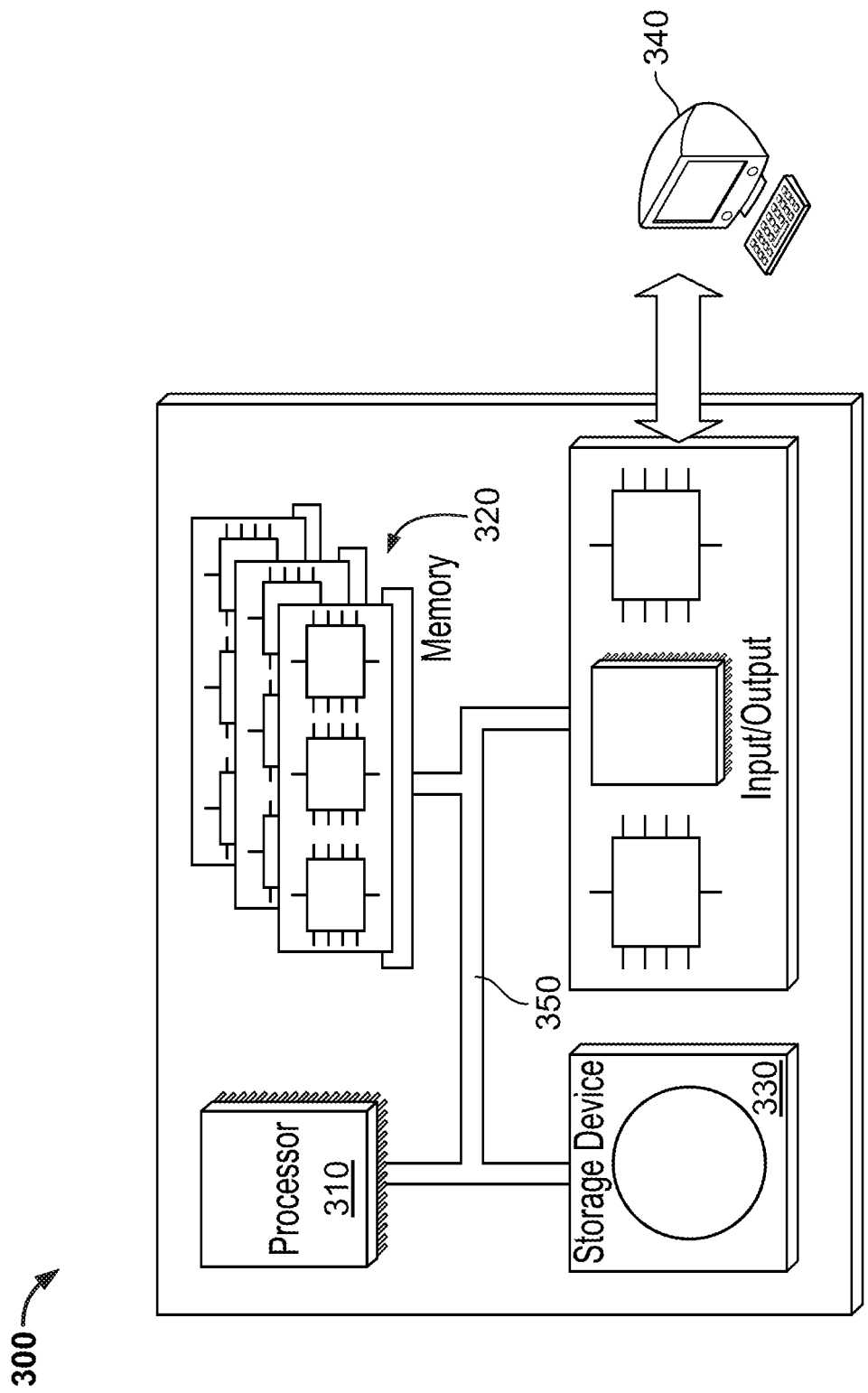
FIG. 3 is a control system (or controller) for a system for determining geologic properties of a rock sample according to the present disclosure.

FIG. 3 is a control system (or controller) 300 for a system for determining geologic properties of a rock sample (such as system 100 shown in FIGS. 1A-1B) according to the present disclosure. For example, all or parts of the controller 300 can be used for the operations described previously, for example as or as part of the control system 999 shown in FIGS. 1A-1B. In some aspects, the control system 300 can represent one of multiple control systems 999 used in the system 100 of FIGS. 1A-1B. The controller 300 is intended to include various forms of digital computers, such as printed circuit boards (PCB), processors, digital circuitry, or otherwise. Additionally the system can include portable storage media, such as, Universal Serial Bus (USB) flash drives. For example, the USB flash drives may store operating systems and other applications. The USB flash drives can include input/output components, such as a wireless transmitter or USB connector that may be inserted into a USB port of another computing device.

The controller 300 includes a processor 310, a memory 320, a storage device 330, and an input/output device 340. Each of the components 310, 320, 330, and 340 are interconnected using a system bus 350. The processor 310 is capable of processing instructions for execution within the controller 300. The processor may be designed using any of a number of architectures. For example, the processor 310 may be a CISC (Complex Instruction Set Computers) processor, a RISC (Reduced Instruction Set Computer) processor, or a MISC (Minimal Instruction Set Computer) processor.

In one implementation, the processor 310 is a single-threaded processor. In another implementation, the processor 310 is a multi-threaded processor. The processor 310 is capable of processing instructions stored in the memory 320 or on the storage device 330 to display graphical information for a user interface on the input/output device 340.

The memory 320 stores information within the controller 300. In one implementation, the memory 320 is a computer-readable medium. In one implementation, the memory 320 is a volatile memory unit. In another implementation, the memory 320 is a non-volatile memory unit.

The storage device 330 is capable of providing mass storage for the controller 300. In one implementation, the storage device 330 is a computer-readable medium. In various different implementations, the storage device 330 may be a floppy disk device, a hard disk device, an optical disk device, a tape device, flash memory, a solid state device (SSD), or a combination thereof.

The input/output device 340 provides input/output operations for the controller 300. In one implementation, the input/output device 340 includes a keyboard and/or pointing device. In another implementation, the input/output device 340 includes a display unit for displaying graphical user interfaces.

The features described can be implemented in digital electronic circuitry, or in computer hardware, firmware, software, or in combinations of them. The apparatus can be implemented in a computer program product tangibly embodied in an information carrier, for example, in a machine-readable storage device for execution by a programmable processor; and method steps can be performed by a programmable processor executing a program of instructions to perform functions of the described implementations by operating on input data and generating output. The described features can be implemented advantageously in one or more computer programs that are executable on a programmable system including at least one programmable processor coupled to receive data and instructions from, and to transmit data and instructions to, a data storage system, at least one input device, and at least one output device. A computer program is a set of instructions that can be used, directly or indirectly, in a computer to perform a certain activity or bring about a certain result. A computer program can be written in any form of programming language, including compiled or interpreted languages, and it can be deployed in any form, including as a stand-alone program or as a module, component, subroutine, or other unit suitable for use in a computing environment.

Suitable processors for the execution of a program of instructions include, by way of example, both general and special purpose microprocessors, and the sole processor or one of multiple processors of any kind of computer. Generally, a processor will receive instructions and data from a read-only memory or a random access memory or both. The essential elements of a computer are a processor for executing instructions and one or more memories for storing instructions and data. Generally, a computer will also include, or be operatively coupled to communicate with, one or more mass storage devices for storing data files; such devices include magnetic disks, such as internal hard disks and removable disks; magneto-optical disks; and optical disks. Storage devices suitable for tangibly embodying computer program instructions and data include all forms of non-volatile memory, including by way of example semiconductor memory devices, such as EPROM, EEPROM, solid state drives (SSDs), and flash memory devices; magnetic disks such as internal hard disks and removable disks; magneto-optical disks; and CD-ROM and DVD-ROM disks. The processor and the memory can be supplemented by, or incorporated in, ASICs (application-specific integrated circuits).

To provide for interaction with a user, the features can be implemented on a computer having a display device such as a CRT (cathode ray tube) or LCD (liquid crystal display) or LED (light-emitting diode) monitor for displaying information to the user and a keyboard and a pointing device such as a mouse or a trackball by which the user can provide input to the computer. Additionally, such activities can be implemented via touchscreen flat-panel displays and other appropriate mechanisms.

The features can be implemented in a control system that includes a back-end component, such as a data server, or that includes a middleware component, such as an application server or an Internet server, or that includes a front-end component, such as a client computer having a graphical user interface or an Internet browser, or any combination of them. The components of the system can be connected by any form or medium of digital data communication such as a communication network. Examples of communication networks include a local area network ("LAN"), a wide area network ("WAN"), peer-to-peer networks (having ad-hoc or static members), grid computing infrastructures, and the Internet.

While this specification contains many specific implementation details, these should not be construed as limitations on the scope of any inventions or of what may be claimed, but rather as descriptions of features specific to particular implementations of particular inventions. Certain features that are described in this specification in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products.

A number of implementations have been described. Nevertheless, it will be understood that various modifications may be made without departing from the spirit and scope of the disclosure. For example, example operations, methods, or processes described herein may include more steps or fewer steps than those described. Further, the steps in such example operations, methods, or processes may be performed in different successions than that described or illustrated in the figures. Accordingly, other implementations are within the scope of the following claims.

What is claimed is:

1. A method of determining a geologic property of a rock sample, comprising:
   (i) measuring a mass of a processed rock sample that comprises a solid matrix and a fluid entrained within the solid matrix;
   (ii) measuring, using nuclear magnetic resonance (NMR), a volume of the fluid entrained within the solid matrix;
   (iii) measuring, using a gas porosimeter, a volume of the solid matrix of the processed rock sample;

(iv) measuring, with a mercury immersion porosimeter, a bulk volume of the processed rock sample; and (v) determining, based at least on the measured volume of the fluid, the measured volume of the solid matrix, and the measured bulk volume, at least one of a bulk density, a grain density, or a porosity of the processed rock sample.

2. The method of claim 1, wherein the processed rock sample is free from chemical cleaning subsequent to removal of the processed rock sample from a subterranean formation.

3. The method of claim 1, wherein the processed rock sample comprises a plurality of drill cuttings or a plurality of crushed rock pieces.

4. The method of claim 3, wherein the plurality of drill cuttings are rinsed and at least partially dried to remove excess fluid from an outer surface of the plurality of drill cuttings prior to step (i).

5. The method of claim 3, wherein each of the plurality of drill cuttings or each of the plurality of crushed rock pieces have an outer dimension in a range of between 0.5 and 3 mm.

6. The method of claim 1, wherein step (iii) comprises measuring the volume of the solid matrix of the processed rock sample using the gas porosimeter using a Boyle's law technique with an inert gas.

7. The method of claim 6, wherein the inert gas comprises at least one of nitrogen, helium, or argon.

8. The method of claim 1, wherein step (ii) comprises measuring, using NMR, the volume of the fluid entrained within the solid matrix with at least one of $T_1$ or $T_2$ measurements of the processed rock sample.

9. The method of claim 1, wherein step (ii) comprises:
determining a density of the fluid entrained within the solid matrix; and
determining a porosity of the fluid entrained within the solid matrix based on the determined volume of the liquid and a volume of the processed rock sample.

10. The method of claim 9, wherein determining the density of the fluid entrained within the solid matrix comprises:
identifying a type of the fluid based on the NMR measurements; and
determining the density of the fluid based on the identified type of the fluid.

11. The method of claim 10, wherein step (v) comprises determining the grain density of the processed rock sample based on the measured mass of the processed rock sample, the density of the fluid, the volume of the solid matrix, and the volume of the fluid entrained in the solid matrix.

12. The method of claim 11, wherein determining the grain density of the processed rock sample based on the mass of the processed rock sample, the density of the fluid, the volume of the solid matrix, and the volume of the fluid entrained in the solid matrix comprises determining the grain density of the processed rock sample from:

$$\rho_g = \frac{M - V_{NMR} * \rho_{liq}}{V_g - V_{NMR}},$$

where
$\rho_g$ is the grain density of the processed rock sample, M is the measured mass of the processed rock sample, $\rho_{liq}$ is the density of the fluid entrained within the solid matrix, $V_{NMR}$ is the volume of the fluid entrained in the solid matrix, and $V_g$ is the volume of the solid matrix.

13. The method of claim 10, wherein step (v) comprises determining the porosity of the processed rock sample based on the bulk volume, the volume of the solid matrix, and the volume of the fluid entrained in the solid matrix.

14. The method of claim 13, wherein determining the porosity of the processed rock sample based on the bulk volume, the volume of the solid matrix, and the volume of the fluid entrained in the solid matrix comprises determining the porosity of the processed rock sample from:

$$\phi = \frac{V_g - V_{NMR}}{V_b},$$

where
$\Phi$ is the porosity of the processed rock sample, $V_{NMR}$ is the volume of the fluid entrained in the solid matrix, $V_g$ is the volume of the solid matrix, and $V_b$ is the bulk volume.

15. The method of claim 10, wherein step (v) comprises determining the bulk density of the processed rock sample based on the mass of the processed rock sample, the density of the fluid, the bulk volume, and the volume of the fluid entrained in the solid matrix.

16. The method of claim 15, wherein determining the bulk density of the processed rock sample based on the mass of the processed rock sample, the density of the fluid, the bulk volume, and the volume of the fluid entrained in the solid matrix comprises determining the bulk density of the processed rock sample from:

$$\rho_b = \frac{M - V_{NMR} * \rho_{liq}}{V_g - V_{NMR}},$$

where
$\rho_b$ is the bulk density of the processed rock sample, M is the measured mass of the processed rock sample, $\rho_{liq}$ is the density of the fluid entrained within the solid matrix, $V_{NMR}$ is the volume of the fluid entrained in the solid matrix, and $V_b$ is the bulk volume.

17. A system for determining a geologic property of a rock sample, comprising:
a gas porosimeter configured to determine a grain volume of a solid matrix of a processed rock sample that comprises the solid matrix and a fluid entrained within the solid matrix;
a scale configured to measure a mass of the processed rock sample;
a nuclear magnetic resonance (NMR) measurement device configured to determine one or more NMR measurements of the processed rock sample;
a mercury immersion porosimeter configured to determine a bulk volume of the processed rock sample; and
a control system configured to perform operations comprising:
(1) determining a volume of the fluid entrained within the solid matrix from the NMR measurements;
(2) identifying the determined grain density of the processed rock sample from the gas porosimeter and the mass of the processed rock sample from the scale;

(3) identifying the determined bulk volume of the processed rock sample with the mercury immersion porosimeter; and (4) determining, based at least one on the determined volume of the fluid, the determined volume of the solid matrix, and the determined bulk volume, at least one of a bulk density, a grain density, or a porosity of the processed rock sample.

18. The system of claim 17, wherein the processed rock sample is free from chemical cleaning subsequent to removal of the processed rock sample from a subterranean formation.

19. The system of claim 17, wherein the processed rock sample comprises a plurality of drill cuttings or a plurality of crushed rock pieces.

20. The system of claim 19, wherein the plurality of drill cuttings are rinsed and at least partially dried to remove excess fluid from an outer surface of the plurality of drill cuttings.

21. The system of claim 19, wherein each of the plurality of drill cuttings or each of the plurality of crushed rock pieces have an outer dimension in a range of between 0.5 and 3 mm.

22. The system of claim 17, wherein step (iii) comprises measuring the volume of the solid matrix of the processed rock sample using the gas porosimeter using a Boyle's law technique with an inert gas.

23. The system of claim 22, wherein the inert gas comprises at least one of nitrogen, helium, or argon.

24. The system of claim 17, wherein the operation of (1) comprises measuring, using NMR, the volume of the fluid entrained within the solid matrix with at least one of $T_1$ or $T_2$ measurements of the processed rock sample.

25. The system of claim 17, wherein the operation of (1) comprises:
determining a density of the fluid entrained within the solid matrix; and
determining a porosity of the fluid entrained within the solid matrix based on the determined volume of the liquid and a volume of the processed rock sample.

26. The system of claim 25, wherein the operation of determining the density of the fluid entrained within the solid matrix comprises:
identifying a type of the fluid based on the NMR measurements; and
determining the density of the fluid based on the identified type of the fluid.

27. The system of claim 26, wherein the operation of (4) comprises determining the grain density of the processed rock sample based on the mass of the processed rock sample, the density of the fluid, the volume of the solid matrix, and the volume of the fluid entrained in the solid matrix.

28. The system of claim 27, wherein the operation of determining the grain density of the processed rock sample based on the mass of the processed rock sample, the density of the fluid, the volume of the solid matrix, and the volume of the fluid entrained in the solid matrix comprises determining the grain density of the processed rock sample from:

$$\rho_g = \frac{M - V_{NMR} * \rho_{liq}}{V_g - V_{NMR}},$$

where
$\rho_g$ is the grain density of the processed rock sample, M is the mass of the processed rock sample, $\rho_{liq}$ is the density of the fluid entrained within the solid matrix, $V_{NMR}$ is the volume of the fluid entrained in the solid matrix, and $V_g$ is the volume of the solid matrix.

29. The system of claim 26, wherein the operation (4) comprises determining the porosity of the processed rock sample based on the bulk volume, the volume of the solid matrix, and the volume of the fluid entrained in the solid matrix.

30. The system of claim 29, wherein the operation of determining the porosity of the processed rock sample based on the bulk volume, the volume of the solid matrix, and the volume of the fluid entrained in the solid matrix comprises determining the porosity of the processed rock sample from:

$$\phi = \frac{V_g - V_{NMR}}{V_b},$$

where
Φ is the porosity of the processed rock sample, $V_{NMR}$ is the volume of the fluid entrained in the solid matrix, $V_g$ is the volume of the solid matrix, and $V_b$ is the bulk volume.

31. The system of claim 26, wherein the operation of (4) comprises determining the bulk density of the processed rock sample based on the mass of the processed rock sample, the density of the fluid, the bulk volume, and the volume of the fluid entrained in the solid matrix.

32. The system of claim 31, wherein the operation of determining the bulk density of the processed rock sample based on the mass of the processed rock sample, the density of the fluid, the bulk volume, and the volume of the fluid entrained in the solid matrix comprises determining the bulk density of the processed rock sample from:

$$\rho_b = \frac{M - V_{NMR} * \rho_{liq}}{V_g - V_{NMR}},$$

where
$\rho_b$ is the bulk density of the processed rock sample, M is the mass of the processed rock sample, $\rho_{liq}$ is the density of the fluid entrained within the solid matrix, $V_{NMR}$ is the volume of the fluid entrained in the solid matrix, and $V_b$ is the bulk volume.

33. A computer-implemented method performed with a computing system that comprises one or more hardware processors, the method comprising:
determining, with the one or more hardware processors, a mass of a processed rock sample;
determining, with the one or more hardware processors, a volume of fluid entrained within a solid matrix of the processed rock sample based on one or more measurements of nuclear magnetic resonance (NMR);
determining, with the one or more hardware processors, a volume of the solid matrix of the processed rock sample based on one or more measurements of a gas porosimeter;
determining, with the one or more hardware processors, a bulk volume of the processed rock sample based on one or more measurements of a mercury immersion porosimeter; and
determining, with the one or more hardware processors, at least one of a bulk density, a grain density, or a porosity of the processed rock sample based on at least the determined volume of the fluid, the determined volume of the solid matrix, and the determined bulk volume.

34. The computer-implemented method of claim 33, wherein the processed rock sample is free from chemical cleaning subsequent to removal of the processed rock sample from a subterranean formation.

35. The computer-implemented method of claim 33, wherein the processed rock sample comprises a plurality of drill cuttings or a plurality of crushed rock pieces.

36. The computer-implemented method of claim 35, wherein the plurality of drill cuttings are rinsed and at least partially dried to remove excess fluid from an outer surface of the plurality of drill cuttings.

37. The computer-implemented method of claim 35, wherein each of the plurality of drill cuttings or each of the plurality of crushed rock pieces have an outer dimension in a range of between 0.5 and 3 mm.

38. The computer-implemented method of claim 33, wherein determining the solid matrix comprises measuring the volume of the solid matrix of the processed rock sample using the gas porosimeter using a Boyle's law technique with an inert gas.

39. The computer-implemented method of claim 38, wherein the inert gas comprises at least one of nitrogen, helium, or argon.

40. The computer-implemented method of claim 33, wherein determining the volume of the fluid comprises measuring, using NMR, the volume of the fluid entrained within the solid matrix with at least one of $T_1$ or $T_2$ measurements of the processed rock sample.

41. The computer-implemented method of claim 33, wherein determining the volume of the fluid comprises:
   determining a density of the fluid entrained within the solid matrix; and
   determining a porosity of the fluid entrained within the solid matrix based on the determined volume of the liquid and a volume of the processed rock sample.

42. The computer-implemented method of claim 41, further comprising determining, with the one or more hardware processors, the grain density of the processed rock sample based on the mass of the processed rock sample, the density of the fluid, the volume of the solid matrix, and the volume of the fluid entrained in the solid matrix.

43. The computer-implemented method of claim 42, wherein determining the grain density of the processed rock sample based on the mass of the processed rock sample, the density of the fluid, the volume of the solid matrix, and the volume of the fluid entrained in the solid matrix comprises determining the grain density of the processed rock sample from:

$$\rho_g = \frac{M - V_{NMR} * \rho_{liq}}{V_g - V_{NMR}},$$

where
   $\rho_g$ is the grain density of the processed rock sample, M is the mass of the processed rock sample, $\rho_{liq}$ is the density of the fluid entrained within the solid matrix, $V_{NMR}$ is the volume of the fluid entrained in the solid matrix, and $V_g$ is the volume of the solid matrix.

44. The computer-implemented method of claim 41, further comprising determining, with the one or more hardware processors, the porosity of the processed rock sample based on the bulk volume, the volume of the solid matrix, and the volume of the fluid entrained in the solid matrix.

45. The computer-implemented method of claim 44, wherein determining the porosity of the processed rock sample based on the bulk volume, the volume of the solid matrix, and the volume of the fluid entrained in the solid matrix comprises determining the porosity of the processed rock sample from:

$$\phi = \frac{V_g - V_{NMR}}{V_b},$$

where
   $\Phi$ is the porosity of the processed rock sample, $V_{NMR}$ is the volume of the fluid entrained in the solid matrix, $V_g$ is the volume of the solid matrix, and $V_b$ is the bulk volume.

46. The computer-implemented method of claim 42, further comprising determining, with the one or more hardware processors, the bulk density of the processed rock sample based on the mass of the processed rock sample, the density of the fluid, the bulk volume, and the volume of the fluid entrained in the solid matrix.

47. The computer-implemented method of claim 46, wherein determining the bulk density of the processed rock sample based on the mass of the processed rock sample, the density of the fluid, the bulk volume, and the volume of the fluid entrained in the solid matrix comprises determining the bulk density of the processed rock sample from:

$$\rho_b = \frac{M - V_{NMR} * \rho_{liq}}{V_g - V_{NMR}},$$

where
   $\rho_b$ is the bulk density of the processed rock sample, M is the mass of the processed rock sample, $\rho_{liq}$ is the density of the fluid entrained within the solid matrix, $V_{NMR}$ is the volume of the fluid entrained in the solid matrix, and $V_b$ is the bulk volume.

* * * * *